(12) United States Patent
Wang et al.

(10) Patent No.: US 9,666,682 B2
(45) Date of Patent: May 30, 2017

(54) REVERSE CONDUCTION INSULATED GATE BIPOLAR TRANSISTOR (IGBT) MANUFACTURING METHOD

(71) Applicant: CSMC TECHNOLOGIES FAB1 CO., LTD., Wuxi New District (CN)

(72) Inventors: Wanli Wang, Wuxi New District (CN); Xiaoshe Deng, Wuxi New District (CN); Genyi Wang, Wuxi New District (CN); Qiang Rui, Wuxi New District (CN)

(73) Assignee: CSMC TECHNOLOGIES FAB1 CO., LTD., Wuxi New District (CN)

( * ) Notice: Subject to any disclaimer, the term of this patent is extended or adjusted under 35 U.S.C. 154(b) by 0 days.

(21) Appl. No.: 14/902,302

(22) PCT Filed: Sep. 2, 2014

(86) PCT No.: PCT/CN2014/085764
§ 371 (c)(1),
(2) Date: Dec. 30, 2015

(87) PCT Pub. No.: WO2015/027961
PCT Pub. Date: Mar. 5, 2015

(65) Prior Publication Data
US 2016/0372571 A1    Dec. 22, 2016

(30) Foreign Application Priority Data
Sep. 2, 2013  (CN) .......................... 2013 1 0392737

(51) Int. Cl.
*H01L 29/66*   (2006.01)
*H01L 29/739*  (2006.01)
(Continued)

(52) U.S. Cl.
CPC ...... *H01L 29/66333* (2013.01); *H01L 21/268* (2013.01); *H01L 21/26513* (2013.01);
(Continued)

(58) Field of Classification Search
CPC ......... H01L 29/66333; H01L 21/26513; H01L 21/268; H01L 21/308; H01L 29/0657; H01L 29/0696; H01L 29/7395
See application file for complete search history.

(56) References Cited

U.S. PATENT DOCUMENTS

2011/0250728 A1* 10/2011 Yamashita ............ H01L 21/266
                                                    438/378
2012/0178223 A1*  7/2012 Nishijo ............... H01L 29/7397
                                                    438/138

FOREIGN PATENT DOCUMENTS

CN    103035691     4/2013
CN    103199018     7/2013
(Continued)

OTHER PUBLICATIONS

Deng et al., U.S. Appl. No. 14/902,516, International Application Filing Date Jul. 29, 2014.
(Continued)

*Primary Examiner* — Karen Kusumakar
(74) *Attorney, Agent, or Firm* — Kagan Binder, PLLC (57) ABSTRACT

A reverse conducting insulated gate bipolar transistor (IGBT) manufacturing method, comprising the following steps: providing a substrate having an IGBT structure formed on the front surface thereof; implanting P+ ions onto the back surface of the substrate; forming a channel on the back surface of the substrate through photolithography and etching processes; planarizing the back surface of the substrate through a laser scanning process to form P-type and N-type interval structures; and forming a back surface collector by conducting a back metalizing process on the
(Continued)

back surface of the substrate. Laser scanning process can process only the back surface structure requiring annealing, thus solve the problem of the front surface structure of the reverse conducting IGBT restricting back surface annealing to a low temperature, improving the P-type and N-type impurity activation efficiency in the back surface structure of the reverse conducting IGBT, and enhancing the performance of the reverse conducting IGBT.

9 Claims, 7 Drawing Sheets

(51) Int. Cl.
*H01L 29/06* (2006.01)
*H01L 21/268* (2006.01)
*H01L 21/324* (2006.01)
*H01L 29/417* (2006.01)
*H01L 29/08* (2006.01)
*H01L 21/265* (2006.01)
*H01L 21/308* (2006.01)

(52) U.S. Cl.
CPC ........ *H01L 21/308* (2013.01); *H01L 21/3247* (2013.01); *H01L 29/0657* (2013.01); *H01L 29/0696* (2013.01); *H01L 29/0834* (2013.01); *H01L 29/41716* (2013.01); *H01L 29/7395* (2013.01)

(56) References Cited

FOREIGN PATENT DOCUMENTS

| JP | 07153942 | 6/1995 |
| WO | 2015/010606 | 1/2015 |
| WO | 2015/014263 | 2/2015 |
| WO | 2015/024502 | 2/2015 |
| WO | 2015/081866 | 6/2015 |
| WO | 2015/103910 | 7/2015 |

OTHER PUBLICATIONS

Zhong et al., U.S. Appl. No. 14/902,517, International Application Filing Date Jul. 22, 2014.
Zhang et al., U.S. Appl. No. 14/902,519, International Application Filing Date Aug. 19, 2014.
Zhang et al., U.S. Appl. No. 15/023,049, International Application Filing Date Dec. 3, 2014.
Jing, U.S. Appl. No. 15/023,057, International Application Filing Date Dec. 4, 2014.
English Translation of PCT Search Report for International Application No. PCT/CN2014/085764; mailed on Nov. 28, 2014.

* cited by examiner

REVERSE CONDUCTION INSULATED GATE BIPOLAR TRANSISTOR (IGBT) MANUFACTURING METHOD

FIELD OF THE INVENTION

The present disclosure relates to a manufacturing method of semiconductor devices, and more particularly relates to a method of manufacturing a reverse conducting insulated gate bipolar transistor.

BACKGROUND OF THE INVENTION

The insulated gate bipolar transistor (IGBT) is a common power switching device controlled by a voltage, it has the features of a large input capacitance, a high input resistance, small drive current, fast speed, high withstand voltage, good thermal stability, a high work temperature, a simple control circuit and the like, so that it has become a mainstream device of the power electronics apparatus at the present stage. The reverse conducting insulated gate bipolar transistor is a novel IGBT device, which integrates an IGBT structure and a reverse conducting diode structure on a same chip. So it can improve the passage of non-balanced carriers and optimize the tail current. The reverse conducting IGBT device has many advantages such as a small size, a high power density, a low cost, a high reliability and the like.

A conventional manufacturing method for the back side structure of the reverse conducting IGBT includes: manufacturing a front side structure, grinding a silicon wafer, coating a photoresist or film on the front side, coating a photoresist on the back side, exposing, developing, afterwards doping P-type impurities by implantation, removing the front protection layer, annealing, performing a back side metallization process, then the manufacturing is completed. However, in this manufacturing method of the reverse conducting IGBT, the annealing temperature of the back side cannot be too high due to the limitation of the front structure, so that the activation efficiency of the N+ and P+ impurities is not high, affecting the performance of the manufactured reverse-conducting IGBT.

SUMMARY OF THE INVENTION

Accordingly, it is necessary to provide a method of manufacturing a reverse conducting insulated gate bipolar transistor, which can improve the phenomena of low activation efficiency of the N-type and P-type impurities in the back structure of the reverse conducting insulated gate bipolar transistor, enhancing the performance of the reverse conducting insulated gate bipolar transistor.

A method of manufacturing a reverse conducting insulated gate bipolar transistor includes the following steps: providing a substrate having an IGBT structure formed on a front side thereof; implanting P+ ions to a back side of the substrate; forming a trench on the back side of the substrate using photolithography, etching process; planarizing the back side of the substrate using laser scanning technology to form a P-type and N-type interval structure; and performing a back side metallization process at the back side of the substrate, and forming a back side collector.

In one embodiment, after providing the substrate having the IGBT structure formed on the front side thereof, the method further comprises: grinding the substrate, and implanting N+ ions to the back side of the substrate to form a field stop layer.

In one embodiment, the providing the substrate having the IGBT structure comprises: implanting N+ ions to the back side of the substrate to form a field stop layer and forming the IGBT structure at the front side of the substrate.

In one embodiment, the forming a trench on the back side of the substrate using photolithography, etching process includes: depositing a dielectric layer; removing partial dielectric layer using photolithography to form a desired pattern; forming the trench by etching; and removing the dielectric layer.

In one embodiment, the trench has a depth of from 0.05 μm to 50 μm; and a width of from 0.1 μm to 500 μm.

In one embodiment, the pattern is a circular or polygonal.

In one embodiment, the substrate has a resistivity of from 0.001 Ω*cm to 200 Ω*cm, and a thickness of from 100 μm to 1000 μm.

In one embodiment, the laser used in the laser scanning technology is pulse laser.

In one embodiment, pulse duration of the pulse laser is from 100 ns to 2000 ns; an energy density thereof is from 1 to 10 J/cm$^2$; a wavelength of the pulse laser is from 200 nm to 10 μm.

In the method of manufacturing the reverse conducting insulated gate bipolar transistor according to the embodiment, the laser scanning technology is employed to perform the planarizing process to the back side of the substrate to form the P-type and N-type alternately interval structure. Since the laser scanning technology can be performed only to the back side of the substrate which requires to be annealed, the problem of not too high annealing temperature of the back side due to the limitation of the front structure of the reverse conducting insulated gate bipolar transistor can be solved, and the phenomena of low activation efficiency of the N-type and P-type impurities in the back structure of the reverse conducting insulated gate bipolar transistor can be improved, thus enhancing the performance of the reverse conducting insulated gate bipolar transistor.

DETAILED DESCRIPTION OF THE EMBODIMENTS

Figure 1:
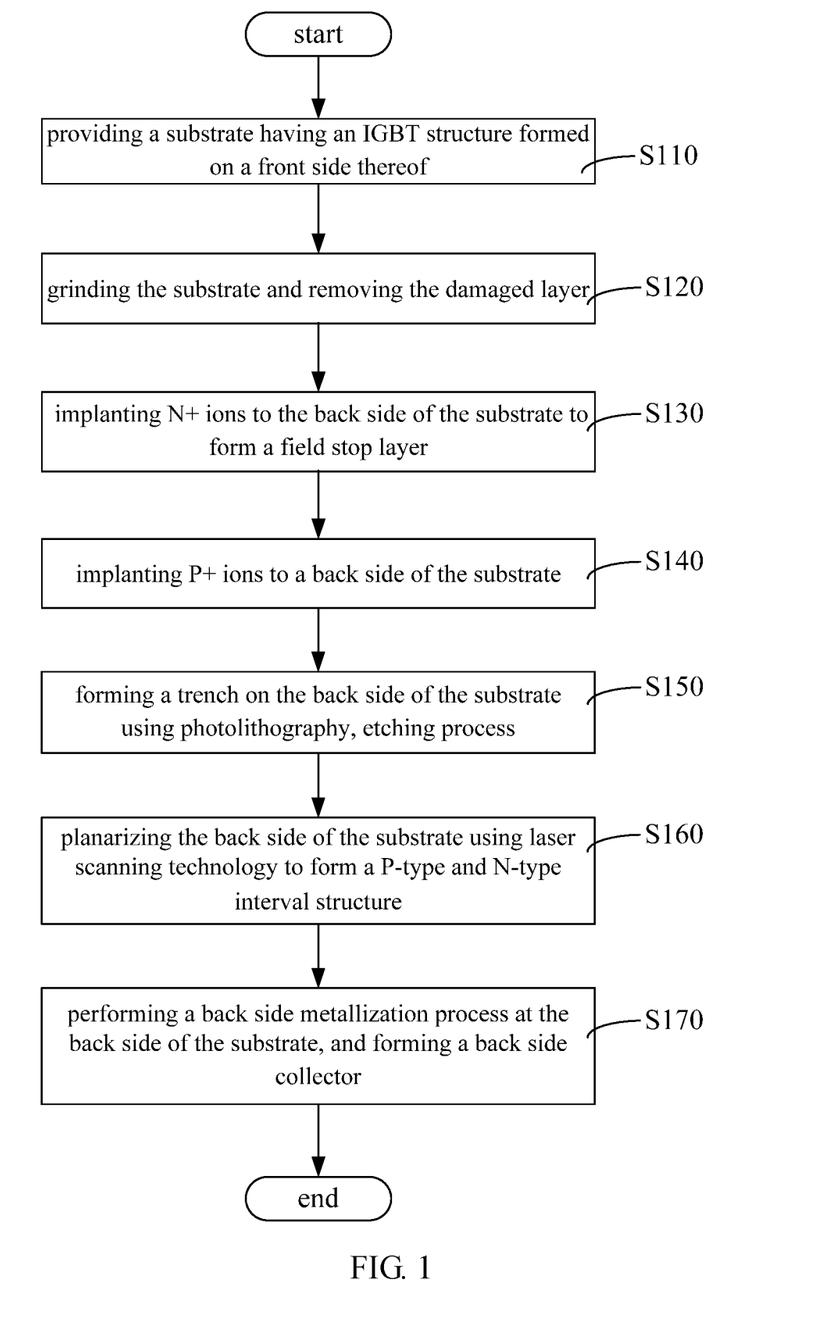
FIG. 1 is a flow chart of a method of manufacturing a reverse conducting insulated gate bipolar transistor in accordance with one embodiment.

Referring to FIG. 1, in one embodiment, a method of manufacturing a reverse conducting insulated gate bipolar transistor is provided. Currently, the common reverse conducting insulated gate bipolar transistor includes a field stop reverse conducting (FS-RC) insulated gate bipolar transistor and a non-punch through reverse conducting (NPT-RC) insulated gate bipolar transistor. The manufacturing method will be described in details using the field stop reverse conducting insulated gate bipolar transistor as an example.

Figure 2:
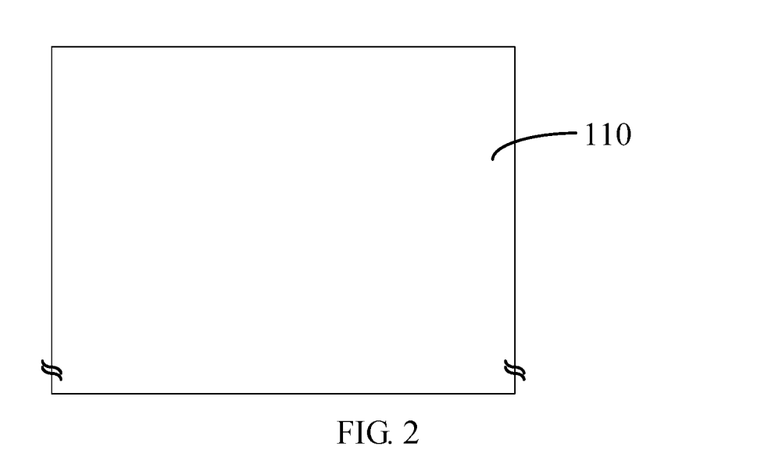
FIGS. 2 to 8 are structure schematic diagrams corresponding to the flow chart of the method of manufacturing the reverse conducting insulated gate bipolar transistor in FIG. 1.

Referring to FIG. 1, in one embodiment, the method of manufacturing a field stop reverse conducting insulated gate bipolar transistor includes the following steps:

In step S110, a substrate having an IGBT structure formed on a front side thereof is provided. Referring also to FIG. 2, in the illustrated embodiment, the substrate 110 is an N-type silicon substrate. The N-type silicon substrate has a resistivity of from 0.001 Ω*cm to 200 Ω*cm, and a thickness of from 100 μm to 1000 μm. The IGBT is a field stop reverse conducting (FS-RC) IGBT. The manufacturing process of a front structure of the FS-RC type IGBT is the same as the manufacturing process of the front structure of the conventional FS (field stop) type IGBT, which mainly includes forming a gate and a collector, and will not be described in greater details.

In step S120, the substrate 110 is ground. The thickness of the substrate 110 is reduced to a target thickness by the grinding process, and a damaged layer generated during the grinding of the substrate 110 is removed using a wet etching process. In alternative embodiment, the grinding step may not be necessary.

Figure 3:
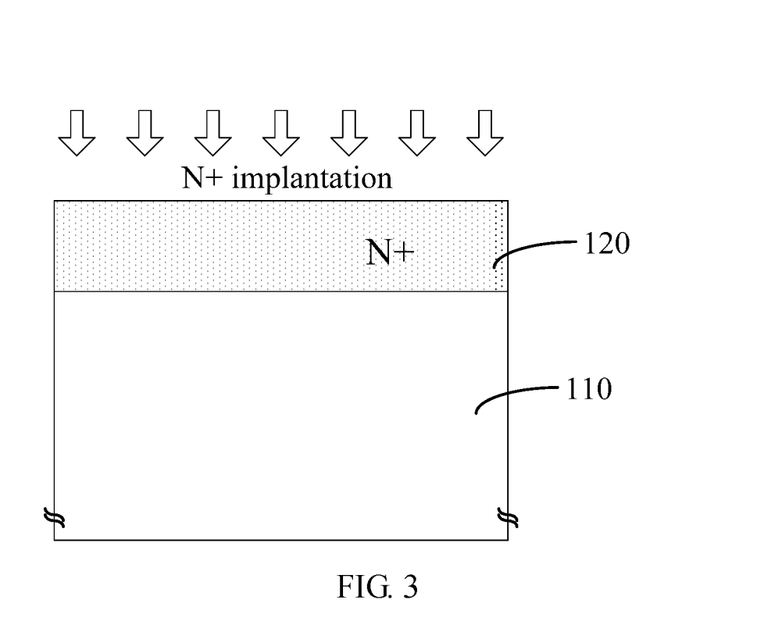

In step S130, N+ ions are implanted to the back side of the substrate 110 to form a field stop layer 120. Referring to FIG. 3, the purpose of step S130 is mainly to form the field stop layer 120 on the back side of the substrate 110. In alternative embodiment, the process of implanting N+ ions to the back side of the substrate 110 to form the field stop layer 120 can be performed prior to the forming of IGBT, and there is no need to grind the substrate 110 after forming the field stop layer 120. In other words, step S110 of providing the substrate having the IGBT structure includes: implanting N+ ions to the back side of the substrate to form the field stop layer and forming the IGBT structure at the front side of the substrate. In the present embodiment, the field stop layer 120 is formed after forming the front side IGBT structure.

Figure 4:
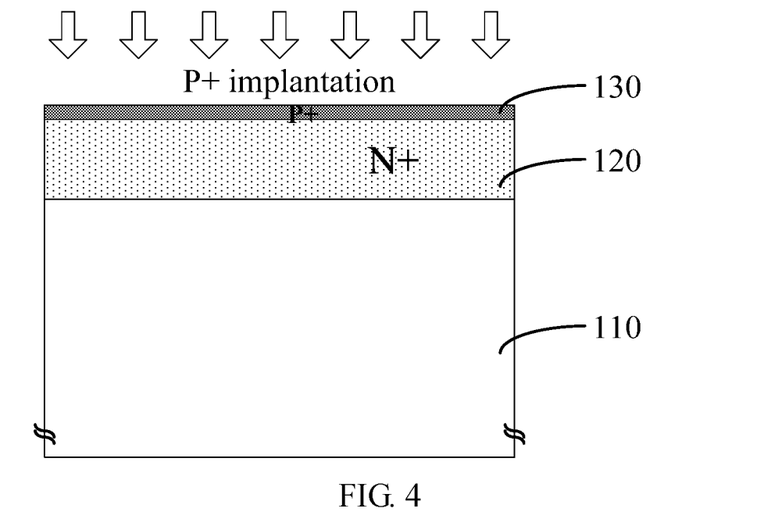

In step S140, P+ ions are implanted to a back side of the substrate 110. Referring to FIG. 4, P+ ions are implanted to the field stop layer 120 to form a P+ layer 130. This step is to make a preparation for the subsequent formation of P-type and N-type interval structure.

In step S150, a trench 140 is formed on the back side of the substrate 110 using photolithography, etching process.

Figure 11:
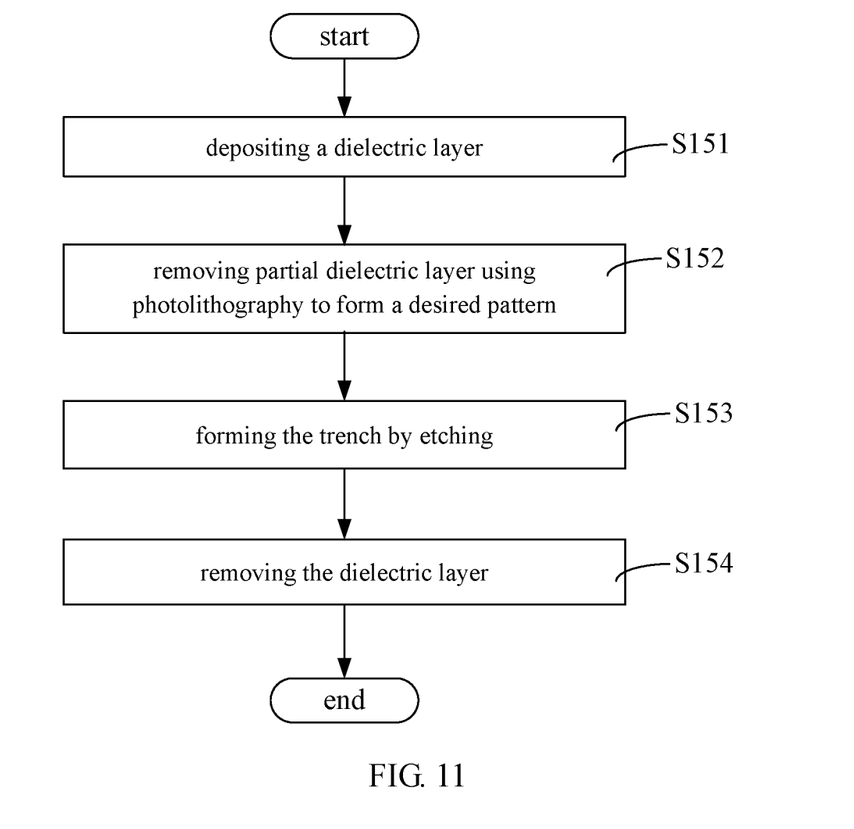
FIG. 11 is a flow chart of a method of forming the trench on the back side of the substrate using photolithography, etching process in accordance with one embodiment.

Referring to FIG. 11, the step S150 specifically includes the following steps.

In step S151, a dielectric layer is deposited. In the illustrated embodiment, the dielectric layer is made of $SiO_2$. In alternative embodiments, the dielectric layer can also be made of other appropriate materials.

In step S152, partial dielectric layer is removed using photolithography to form a desired pattern. This step is mainly a process of pattern transformation, which can remove partial dielectric layer to form the desired pattern, thus facilitating forming the desired trench 140 on the field stop layer 120.

Figure 5:
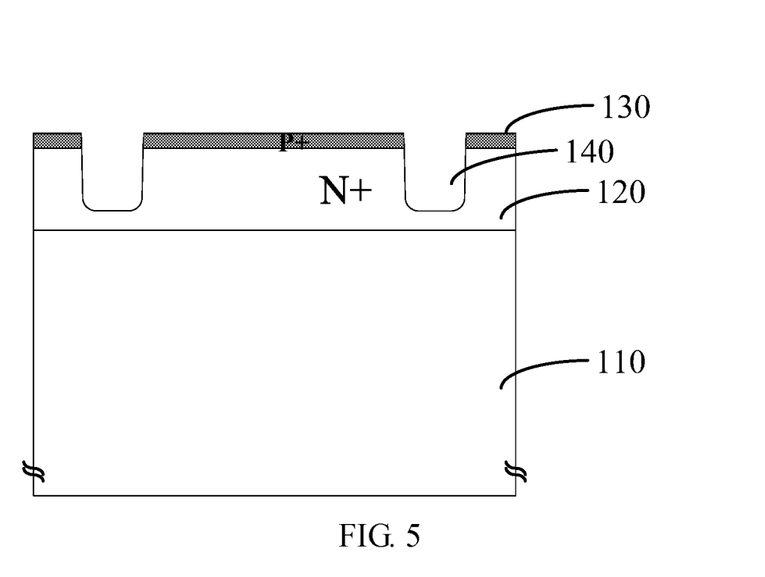
Figure 10:
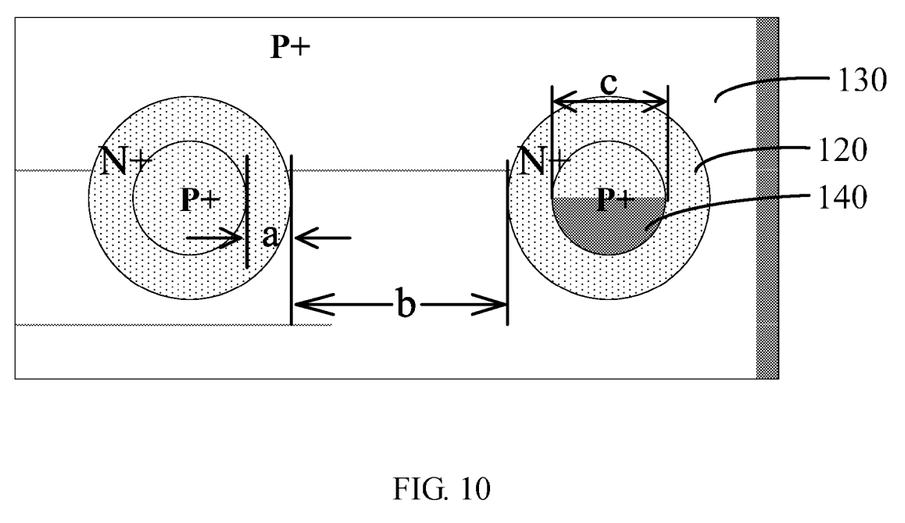
FIG. 10 is a top view of the RC structure of the reverse conducting insulated gate bipolar transistor of FIG. 9.

In step S153, the trench 140 is formed by etching. Referring to FIG. 5, the trench formed by etching has a depth of from 0.05 μm to 50 μm; and a width of from 0.1 μm to 500 μm. The pattern formed by the trench 140 on the back side of the substrate 110 can be circular or polygonal, or any appropriate shapes. In the illustrated embodiment, the pattern formed by the trench 140 on the back side of the substrate 110 is circular, as shown in FIG. 10.

In step S154, the dielectric layer is removed. The dielectric layer deposited in step S151 is removed, and the structure after removing the dielectric layer is shown in FIG. 5.

Figure 6:
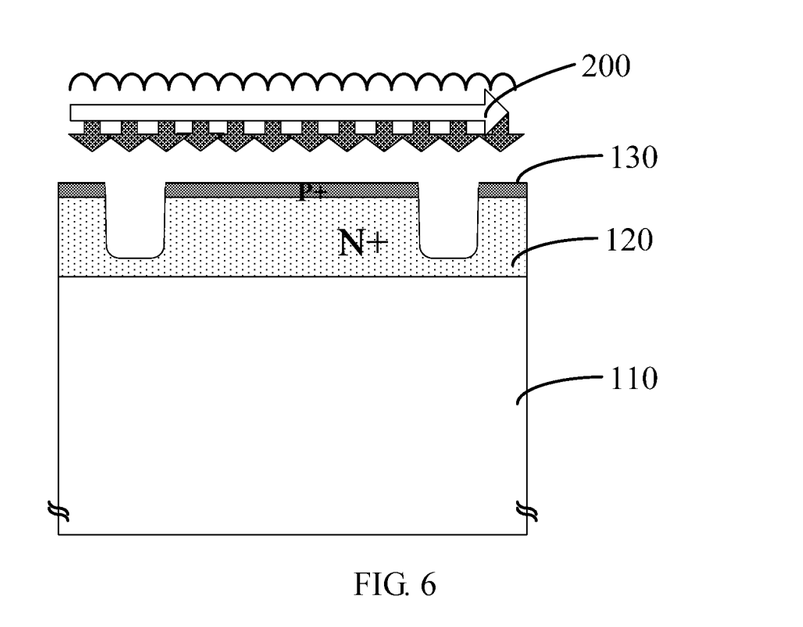
Figure 7:
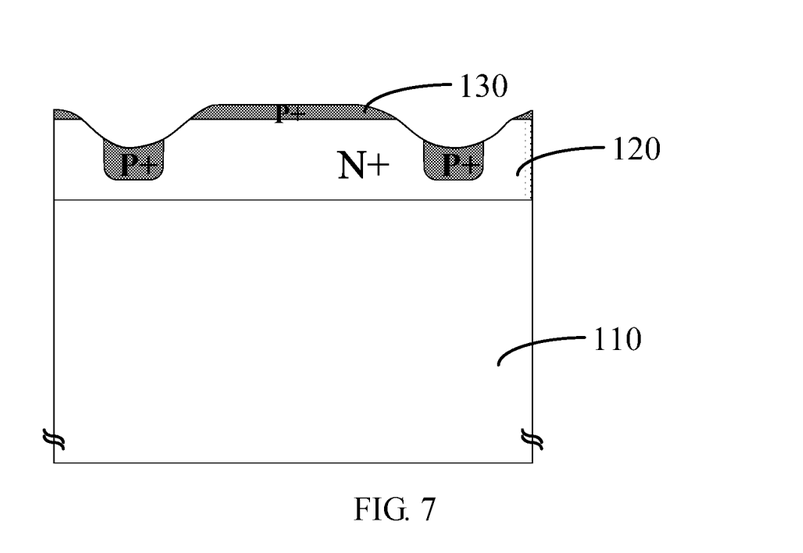

In step S160, a planarizing process is performed to the back side of the substrate 110 using laser scanning technology to form a P-type and N-type interval structure. Referring to FIGS. 6 and 7, the P-type and N-type interval structure is the reverse conducting (RC) structure of the field stop reverse conducting insulated gate bipolar transistor. In step S160, the expected flatness can be obtained by adjusting the power, scan rate and other parameters of the laser. In the illustrated embodiment, the laser used in the laser scanning technology is pulse laser 200. Pulse duration of the pulse laser 200 is from 100 ns to 2000 ns; an energy density thereof is from 1 to 10 $J/cm^2$; a wavelength of the pulse laser 200 is from 200 nm to 10 μm. The laser scanning technology not only can achieve planarized back side of the substrate 110 and form the RC structure, it can also complete the activation of the N-type and P-type impurities implanted on the back side of the substrate 110, such that no additional annealing step is required, thus omitting one process. In addition, since the laser scanning technology can be performed only to the back side of the substrate 110 which is about to be annealed, the impact to the front side of the substrate 110 is minimal, such that the problem of not too high annealing temperature of the back side due to the limitation of the front structure of the field stop reverse conducting insulated gate bipolar transistor can be solved, and the phenomena of low activation efficiency of the N-type and P-type impurities in the back structure of the field stop reverse conducting insulated gate bipolar transistor can be improved, thus enhancing the performance of the field stop reverse conducting insulated gate bipolar transistor.

Figure 8:
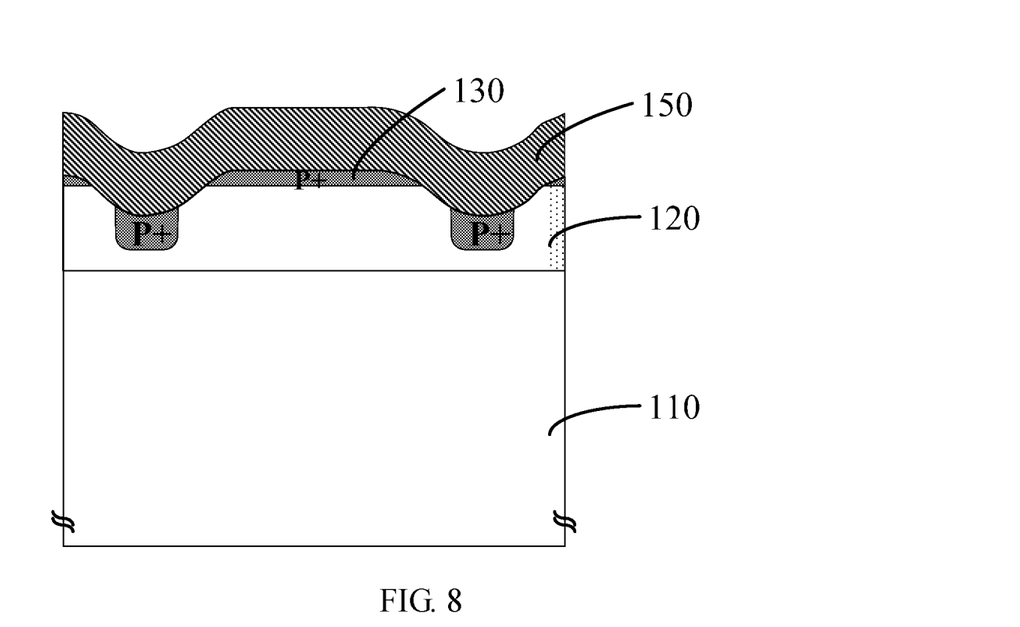

In step S170, a back side metallization process is performed, thus the back side collector 150 is formed. Referring to FIG. 8, the back side collector 150 can be formed by the back side metallization process, and then the manufacturing of the field stop reverse conducting insulated gate bipolar transistor is completed.

Figure 9:
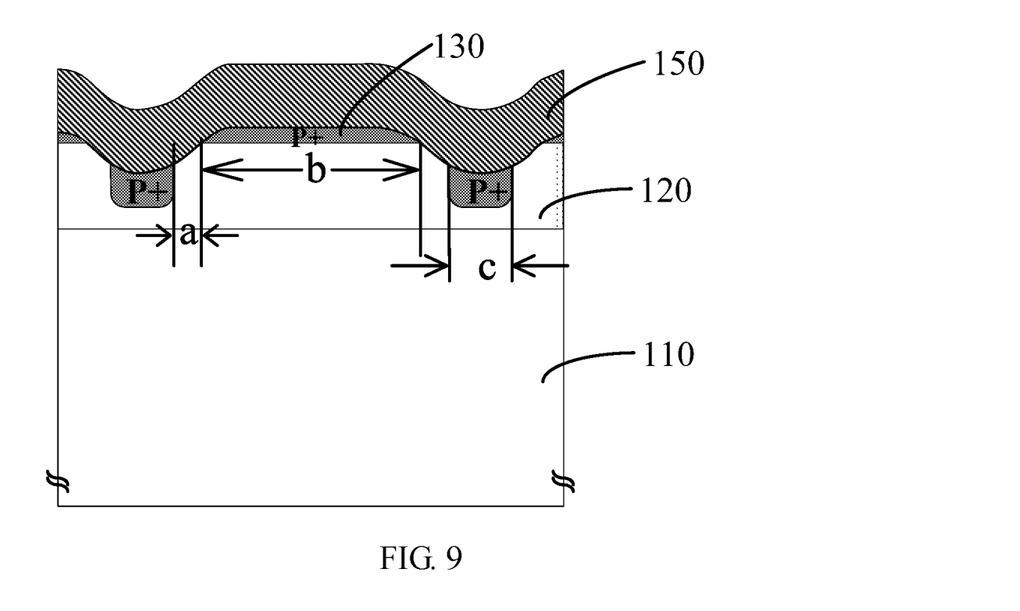
FIG. 9 is a sectional view of an RC structure of the reverse conducting insulated gate bipolar transistor.

Referring to FIG. 9 and FIG. 10, where a represents a width of the N+ region, b represents a distance between two N+ regions, c represents a width of the P+ region. The dimensions of the b and c can be adjusted by the photolithography step. When the parameters of the reverse conducting diode of the field stop reverse conducting insulated gate bipolar transistor is to be changed, it only requires adjusting the parameters of a, b, and c and the shapes of the N+ region and P+ region. By adjusting the power and scan rate of the laser scanning process, the planarizing can be controlled, thus the value of a can be adjusted. The parameters of b and c and the shapes of the N+ region and P+ region can be adjusted in step S150.

The manufacturing method described above is for the field stop reverse conducting insulated gate bipolar transistor, and the manufacturing method for the non-punch through reverse conducting insulated gate bipolar transistor is similar to the manufacturing method of the field stop reverse conducting insulated gate bipolar transistor, the difference lies in that: there is no need to conduct step S130 during the manufacturing of the non-punch through reverse conducting insulated gate bipolar transistor, in other words, there is no need to form the field stop layer by implanting N+ ions to the back side of the substrate. In addition, during the manufacturing of the non-punch through reverse conducting insulated gate bipolar transistor, the employed substrate has a resistivity of from 0.001 Ω*cm to 200 Ω*cm, and a thickness of from 100 μm to 1000 μm. The rest of the process is the same as that in the manufacturing of the field stop reverse conducting insulated gate bipolar transistor, which will be described in further details.

In the manufacturing of the non-punch through reverse conducting insulated gate bipolar transistor, a planarizing process is also performed to the back side of the substrate using laser scanning technology to form a P-type and N-type interval structure. Therefore, the method of manufacturing of the non-punch through reverse conducting insulated gate bipolar transistor can also improve the phenomena of low activation efficiency of the N-type and P-type impurities in the back structure of the reverse conducting insulated gate bipolar transistor, thus enhancing the performance of the reverse conducting insulated gate bipolar transistor and omitting an annealing process.

In the method of manufacturing the reverse conducting insulated gate bipolar transistor according to the embodiment, the laser scanning technology is employed to perform the planarizing process to the back side of the substrate to form the P-type and N-type interval structure. Since the laser scanning technology can be performed only to the back side of the substrate which requires be annealed, the problem of not too high annealing temperature of the back side due to the limitation of the front structure of the reverse conducting insulated gate bipolar transistor can be solved, and the phenomena of low activation efficiency of the N-type and P-type impurities in the back structure of the reverse conducting insulated gate bipolar transistor can be improved, thus enhancing the performance of the reverse conducting insulated gate bipolar transistor. Additionally, the laser scanning technology can also complete the activation of the N-type and P-type impurities implanted on the back side of the substrate, such that no additional annealing step is required, thus omitting one process.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A method of manufacturing a reverse conducting insulated gate bipolar transistor, comprising the following steps:
   providing a substrate having an IGBT structure formed on a front side thereof;
   implanting P+ ions to a back side of the substrate;
   forming a trench on the back side of the substrate using photolithography, etching process;
   planarizing the back side of the substrate using laser scanning technology to form a P-type and N-type interval structure; and
   performing a back side metallization process at the back side of the substrate, and forming a back side collector.

2. The method of manufacturing the reverse conducting insulated gate bipolar transistor according to claim 1, wherein after providing the substrate having the IGBT structure formed on the front side thereof, the method further comprises: grinding the substrate, and implanting N+ ions to the back side of the substrate to form a field stop layer.

3. The method of manufacturing the reverse conducting insulated gate bipolar transistor according to claim 1, wherein the providing the substrate having the IGBT structure comprises: implanting N+ ions to the back side of the substrate to form a field stop layer and forming the IGBT structure at the front side of the substrate.

4. The method of manufacturing the reverse conducting insulated gate bipolar transistor according to claim 1, wherein the forming the trench on the back side of the substrate using photolithography, etching process comprises:
   depositing a dielectric layer;
   removing partial dielectric layer using photolithography to form a desired pattern;
   forming the trench by etching; and
   removing the dielectric layer.

5. The method of manufacturing the reverse conducting insulated gate bipolar transistor according to claim 4, wherein the trench has a depth of from 0.05 μm to 50 μm; and a width of from 0.1 μm to 500 μm.

6. The method of manufacturing the reverse conducting insulated gate bipolar transistor according to claim 4, wherein the pattern is a circular or polygonal.

7. The method of manufacturing the reverse conducting insulated gate bipolar transistor according to claim 1, wherein the substrate has a resistivity of from $0.001 \Omega*cm$ to $200 \Omega*cm$, and a thickness of from 100 μm to 1000 μm.

8. The method of manufacturing the reverse conducting insulated gate bipolar transistor according to claim 1, wherein the laser used in the laser scanning technology is pulse laser.

9. The method of manufacturing the reverse conducting insulated gate bipolar transistor according to claim 8, wherein pulse duration of the pulse laser is from 100 ns to 2000 ns; an energy density thereof is from 1 to 10 $J/cm^2$; a wavelength of the pulse laser is from 200 nm to 10 μm.

* * * * *